(12) United States Patent
Kim et al.

(10) Patent No.: US 11,690,248 B2
(45) Date of Patent: Jun. 27, 2023

(54) LIGHT EMITTING DISPLAY DEVICE INCLUDING HYDROGEN OR OXYGEN ABSORBING LAYER

(71) Applicant: LG Display Co., Ltd., Seoul (KR)

(72) Inventors: Yeon Kim, Seoul (KR); Goeun Kim, Incheon (KR); HyeonTae Seo, Goyang-si (KR); Eunjin Kim, Gunpo-si (KR); Jungyeon Kim, Seoul (KR); JinHo Kim, Paju-si (KR); Tae-Hoon Kim, Goyang-si (KR); KyoungHoon Kim, Paju-si (KR); KwangSeon Lee, Paju-si (KR); Hongdae Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 141 days.

(21) Appl. No.: 17/137,897

(22) Filed: Dec. 30, 2020

(65) Prior Publication Data

US 2021/0202911 A1    Jul. 1, 2021

(30) Foreign Application Priority Data

Dec. 31, 2019 (KR) .......................... 10-2019-0179939
Jun. 23, 2020 (KR) .......................... 10-2020-0076718

(51) Int. Cl.
*H01L 51/52* (2006.01)
*H01L 51/10* (2006.01)
(Continued)

(52) U.S. Cl.
CPC .......... *H10K 50/846* (2023.02); *H10K 50/844* (2023.02); *H10K 10/88* (2023.02);
(Continued)

(58) Field of Classification Search
CPC ............ H01L 51/5259; H01L 51/5253; H01L 51/107; H01L 51/448; H01L 51/5237;
(Continued)

(56) References Cited

U.S. PATENT DOCUMENTS 7,446,336 B2 * 11/2008 Yamazaki ........... H01L 27/3244
257/E33.059
2015/0048361 A1 * 2/2015 Yamakita ............ H01L 29/7869
257/43
(Continued)

FOREIGN PATENT DOCUMENTS

KR   10-2013-0009723 A   1/2013
KR   10-2015-0037843 A   4/2015
(Continued)

*Primary Examiner* — Ida M Soward
(74) *Attorney, Agent, or Firm* — Polsinelli PC

(57) ABSTRACT

A light emitting display device includes a lower substrate, a thin film transistor on the lower substrate, a passivation layer disposed on the thin film transistor and including hydrogen, an overcoating layer disposed on the passivation layer and planarizing the passivation layer, a light emitting element disposed on the overcoating layer and including an anode, a light emitting layer on the anode, and a cathode on the light emitting layer, a bank disposed on the overcoating layer and defining a light emitting area, an adhesive layer on the light emitting element and the bank, and a hydrogen absorbing layer disposed on the adhesive layer and including a hydrogen absorbing filler, wherein a side end of the bank is disposed more inwardly than side ends of the adhesive layer and the hydrogen absorbing layer, wherein the side ends of the adhesive layer and the hydrogen absorbing layer are disposed more inwardly than a side end of the overcoating layer.

24 Claims, 9 Drawing Sheets

(51) Int. Cl.
- *H01L 51/44* (2006.01)
- *H01L 27/32* (2006.01)
- *H10K 50/84* (2023.01)
- *H10K 50/844* (2023.01)
- *H10K 10/88* (2023.01)
- *H10K 30/88* (2023.01)
- *H10K 50/818* (2023.01)
- *H10K 50/86* (2023.01)
- *H10K 50/842* (2023.01)
- *H10K 59/35* (2023.01)
- *H10K 59/38* (2023.01)
- *H10K 59/122* (2023.01)
- *H10K 59/124* (2023.01)
- *H10K 102/00* (2023.01)

(52) U.S. Cl.
CPC ........... *H10K 30/88* (2023.02); *H10K 50/818* (2023.02); *H10K 50/84* (2023.02); *H10K 50/8426* (2023.02); *H10K 50/865* (2023.02); *H10K 59/122* (2023.02); *H10K 59/124* (2023.02); *H10K 59/35* (2023.02); *H10K 59/351* (2023.02); *H10K 59/353* (2023.02); *H10K 59/38* (2023.02); *H10K 2102/00* (2023.02)

(58) Field of Classification Search
CPC ............. H01L 51/5284; H01L 51/5246; H01L 51/5218; H01L 2251/301; H01L 27/322; H01L 27/3246; H01L 27/3258; H01L 27/3244; H01L 27/3211; H01L 27/3295; H01L 27/3213; H01L 27/3218
See application file for complete search history.

(56) References Cited

U.S. PATENT DOCUMENTS

| | | | | |
|---|---|---|---|---|
| 2015/0102332 | A1* | 4/2015 | Shin | H01L 51/5259 438/23 |
| 2015/0144943 | A1* | 5/2015 | Seo | H01L 29/7869 438/23 |
| 2015/0340655 | A1* | 11/2015 | Lee | H01L 27/3211 257/40 |
| 2016/0087241 | A1* | 3/2016 | Kim | H01L 51/5253 438/23 |
| 2017/0162814 | A1* | 6/2017 | Shin | H01L 51/0096 |
| 2019/0058021 | A1* | 2/2019 | Kim | H01L 27/3276 |
| 2019/0157618 | A1* | 5/2019 | Park | H01L 51/5253 |
| 2020/0075887 | A1* | 3/2020 | Kim | H01L 51/5259 |
| 2021/0273196 | A1* | 9/2021 | Fang | H01L 27/3218 |
| 2022/0052293 | A1* | 2/2022 | Hirase | H01L 51/5228 |

FOREIGN PATENT DOCUMENTS

| | | | | |
|---|---|---|---|---|
| KR | 10-2016-0066640 A | | 6/2016 | |
| KR | 2017002985 A | * | 1/2017 | ........... H01L 27/322 |
| KR | 10-2017-0073993 A | | 6/2017 | |
| KR | 10-2018-0035000 A | | 4/2018 | |

* cited by examiner

LIGHT EMITTING DISPLAY DEVICE INCLUDING HYDROGEN OR OXYGEN ABSORBING LAYER

CROSS-REFERENCE TO RELATED APPLICATION

This application claims the priority benefit of Korean Patent Application No. 10-2019-0179939 filed on Dec. 31, 2019, and Korean Patent Application No. 10-2020-0076718 filed on Jun. 23, 2020, which are hereby incorporated by reference in their entirety.

BACKGROUND

Field of the Disclosure

The present disclosure relates to a light emitting display device and more particularly, to a light emitting display device capable of reducing defects of a thin film transistor due to hydrogen.

Description of the Background

A light emitting display device is a self-light emitting display device, and may be manufactured to be light and thin since it does not require a separate light source, unlike a liquid crystal display device having a separate light source. In addition, the light emitting display device has advantages in terms of power consumption due to a low voltage driving, and is excellent in terms of a color implementation, a response speed, a viewing angle, and a contrast ratio (CR). Therefore, light emitting display devices are being studied as next-generation display devices.

Such a light emitting display device emits light by driving a light emitting element disposed in each sub-pixel. At this time, one or more thin film transistors (TFT) electrically connected to the light emitting element are disposed in each sub-pixel to independently drive the light emitting element of each sub-pixel.

SUMMARY

A thin film transistor includes a gate electrode, a source electrode, a drain electrode, and a semiconductor layer. The source electrode and the drain electrode contact the semiconductor layer, and the gate electrode is disposed to overlap the semiconductor layer. When a gate voltage more than a predetermined voltage is applied to the gate electrode of the thin film transistor, a channel is formed in the semiconductor layer so that current flows between the source electrode and the drain electrode. As such, the thin film transistor has switching characteristics, and such switching characteristics may be determined by various factors. For example, when a material of the semiconductor layer is deformed, mobility of the thin film transistor may be changed, and the switching characteristics of the thin film transistor may be changed.

A light emitting display device includes a passivation layer for protecting the light emitting element from moisture or oxygen which penetrates the light emitting element. The passivation layer is formed on an optical element to protect the light emitting element.

Such a passivation layer is formed by for example, chemical vapor deposition (CVD) using silane (SiH4) and ammonia (NH3). A small amount of hydrogen may be generated from silane and ammonia in a film-formation process of the passivation layer by chemical vapor deposition. Accordingly, hydrogen generated in the film-formation process of the passivation layer may be diffused into and included in the passivation layer. Residual hydrogen included in the passivation layer may move inside the light emitting element. When the residual hydrogen diffuses into and reacts with the semiconductor layer of the thin film transistor, characteristics of the thin film transistor may be changed. Accordingly, hydrogen generated in the film-formation process of the passivation layer may degrade performance of the light emitting display device as well as performance of the thin film transistor.

To solve a problem in which hydrogen generated when the passivation layer of the light emitting display device is formed remains in the light emitting display device and as the remaining hydrogen diffuses to the thin film transistor, characteristics of the thin film transistor are changed to thereby degrade the performance of the light emitting display device, as described above, the inventors of the present disclosure have invented a novel structure of a light emitting display device capable of absorbing hydrogen included in a passivation layer, and a method of manufacturing the same.

Accordingly, the present disclosure provides a light emitting display device capable of absorbing hydrogen remaining in a passivation layer and preventing performance of a thin film transistor from being degraded.

In addition, the present disclosure provides a light emitting display device having a structure capable of removing hydrogen in a passivation layer without additional equipment for removing the hydrogen generated in a film-formation process of the passivation layer.

Also, the present disclosure can significantly improve a performance of removing hydrogen inside a light emitting display device without lowering durability or light emission characteristics of the light emitting display device.

Further, the present disclosure provides a light emitting display device having a structure capable of blocking oxygen injected to the inside from the outside thereof.

Furthermore, the present disclosure can solve defects of white or dark spots of pixels generated by hydrogen or oxygen.

The present disclosure is not limited to the above-mentioned objects, and other objects, which are not mentioned above, can be clearly understood by those skilled in the art from the following descriptions.

According to an exemplary aspect of the present disclosure, a light emitting display device includes a lower substrate; a thin film transistor on the lower substrate; a passivation layer disposed on the thin film transistor and including hydrogen; an overcoating layer disposed on the passivation layer and planarizing the passivation layer; a light emitting element disposed on the overcoating layer and including an anode, a light emitting layer on the anode, and a cathode on the light emitting layer; a bank disposed on the overcoating layer and defining a light emitting area; an adhesive layer on the light emitting element and the bank; and a hydrogen absorbing layer disposed on the adhesive layer and including a hydrogen absorbing filler, wherein a side end of the bank is disposed more inwardly than side ends of the adhesive layer and the hydrogen absorbing layer, wherein the side ends of the adhesive layer and the hydrogen absorbing layer are disposed more inwardly than a side end of the overcoating layer.

According to another aspect of the present disclosure, a light emitting display device includes a lower substrate; a thin film transistor on the lower substrate; a passivation layer disposed on the thin film transistor and including hydrogen; an overcoating layer disposed on the passivation layer and planarizing the passivation layer; a light emitting element disposed on the overcoating layer and including an anode, a light emitting layer on the anode, and a cathode on the light emitting layer; a bank disposed on the overcoating layer and defining a light emitting area; and an adhesive layer disposed on the light emitting element and the bank and including a hydrogen absorbing filler or an oxygen absorbing filler, wherein the hydrogen absorbing filler or the oxygen absorbing filler is disposed to be adjacent to the passivation layer.

Other detailed matters of the exemplary aspects are included in the detailed description and the drawings.

According to the present disclosure, it is feasible to prevent a reduction in performance of a thin film transistor by configuring a hydrogen absorbing layer capable of absorbing residual hydrogen in a passivation layer, which may change characteristics of the thin film transistor.

According to the present disclosure, damage to a light emitting element due to moisture or foreign matter can be prevented by further including an upper protective layer for protecting the light emitting element, so that element reliability can be greatly improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
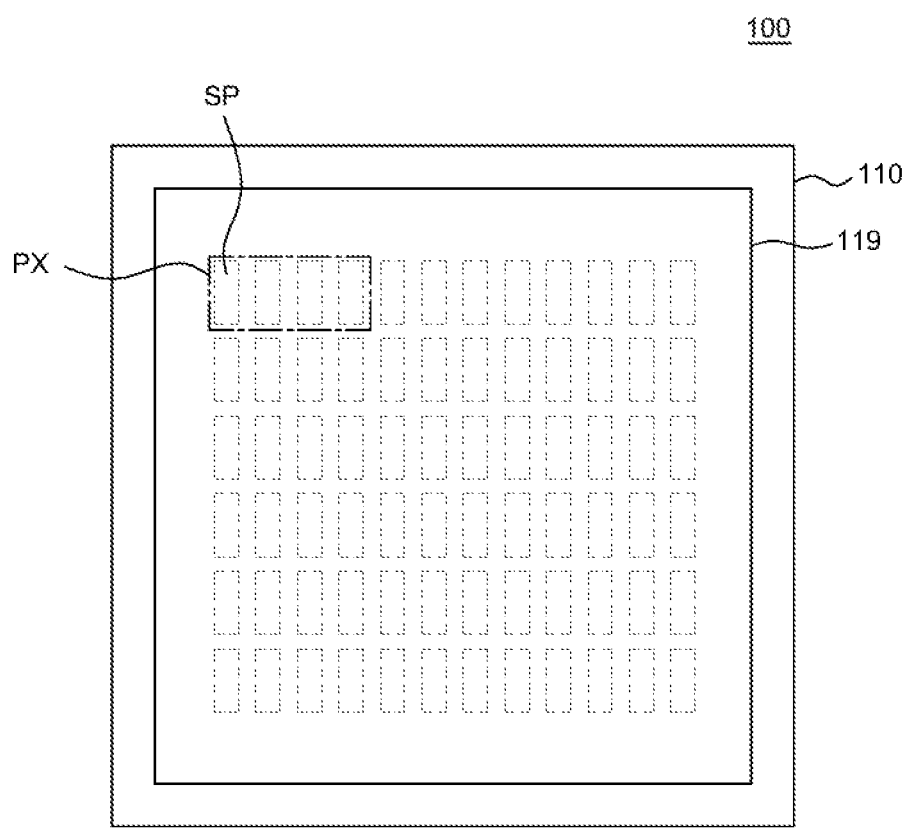
FIG. 1 is a plan view of a light emitting display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a light emitting display device according to exemplary aspects of the present disclosure will be described in detail with reference to accompanying drawings.

FIG. 1 is a plan view of a light emitting display device according to an exemplary aspect of the present disclosure.

Figure 2:
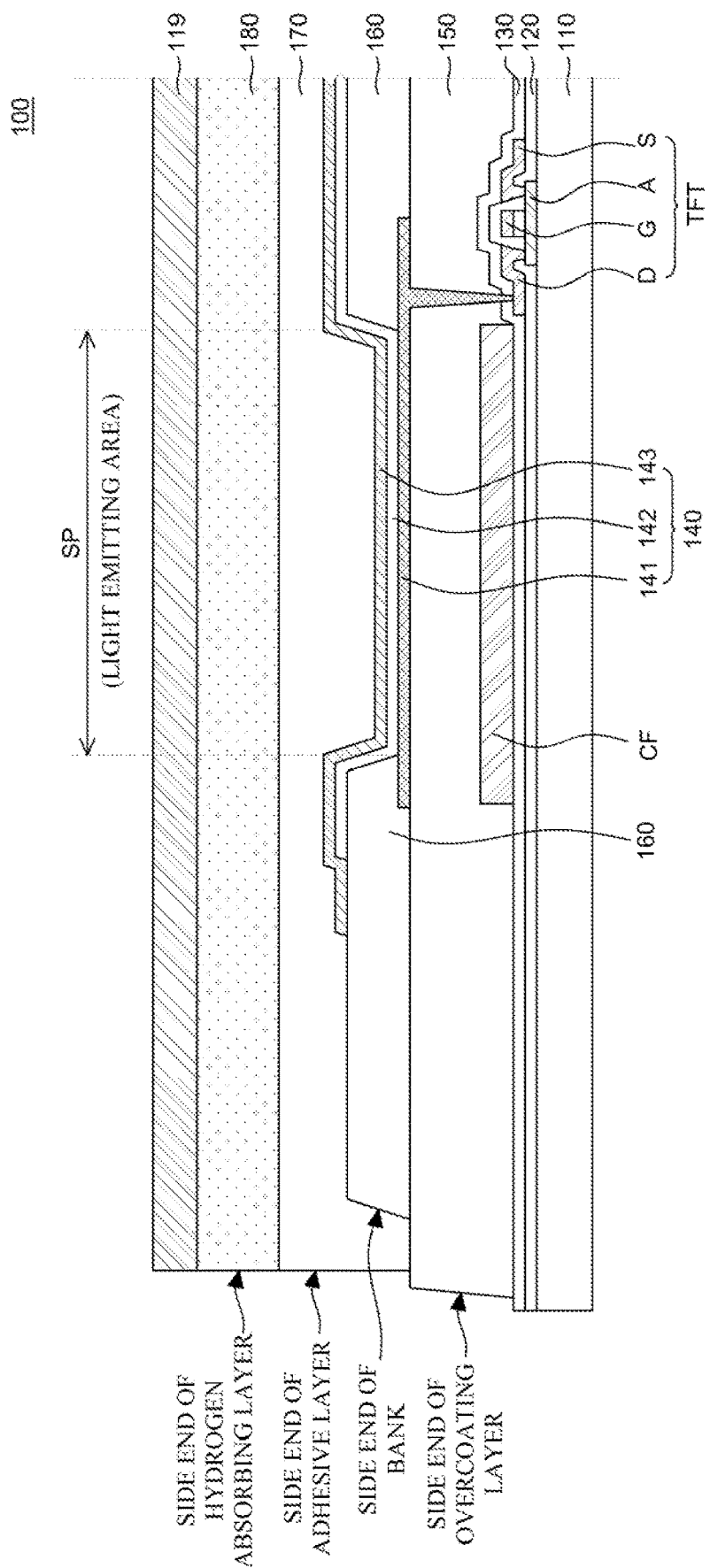
FIG. 2 is a cross-sectional view of one sub-pixel of the light emitting display device according to an exemplary aspect of the present disclosure.

FIG. 2 is a cross-sectional view of one sub-pixel of the light emitting display device according to an exemplary aspect of the present disclosure.

Specifically, FIG. 2 is a cross-sectional view of one side of a light emitting display device 100.

With reference to FIGS. 1 and 2, the light emitting display device 100 includes a lower substrate 110, a gate insulating layer 120, a thin film transistor TFT, a passivation layer 130, a light emitting element 140, an overcoating layer 150, a bank 160, an adhesive layer 170, a hydrogen absorbing layer 180, and an upper substrate 119.

For reference, FIG. 1 illustrates only the lower substrate 110 and the upper substrate 119 of the light emitting display device 100 for convenience of description.

With reference to FIG. 1, the light emitting display device 100 includes a plurality of pixels PX. Each of the pixels PX includes a plurality of sub-pixels SP. The sub-pixels SP may be basic light emitting units constituting the light emitting display device 100, and the respective sub-pixels SP each constituting one pixel PX emit light of different colors. As illustrated in FIG. 1, the sub-pixels SP may include a red sub-pixel, a green sub-pixel, a blue sub-pixel, and a white sub-pixel, or may include only a red sub-pixel, a green sub-pixel, and a blue sub-pixel.

In addition, with reference to FIG. 2, the light emitting display device 100 according to an exemplary aspect may include sub-pixels SP having a color-filter on transistor (COT) structure. For example, a color of each sub-pixel SP may be implemented by a color filter CF disposed on an upper layer of the thin film transistor TFT so as to overlap a light emitting area of the sub-pixel SP. For example, when the light emitting element 140 emits white light, a red color filter CF is disposed in an area corresponding to a light emitting area of the light emitting element 140, whereby a red sub-pixel SP may be implemented. In addition, a green color filter CF is disposed in an area corresponding to the light emitting area of the light emitting element 140, whereby a green sub-pixel SP may be implemented. Also, a blue color filter CF is disposed in an area corresponding to the light emitting area of the light emitting element 140, whereby a blue sub-pixel SP may be implemented. Further, a white sub-pixel SP may be implemented by not disposing the color filter CF in an area corresponding to the light emitting area of the light emitting element 140. Concrete contents of the color filter CF will be described later.

The thin film transistor TFT including a semiconductor layer A, a gate electrode G, a source electrode S, and a drain electrode D is formed on the lower substrate 110 formed of an insulating material. For example, the semiconductor layer A is formed on the lower substrate 110, and the gate insulating layer 120 for insulating the gate electrode G and the semiconductor layer A is formed on the semiconductor layer A and the lower substrate 110. The gate electrode G is formed on the gate insulating layer 120, and the source electrode S and the drain electrode D are formed on the semiconductor layer A and the gate insulating layer 120. The source electrode S and the drain electrode D are electrically connected to the semiconductor layer A in a manner of being in contact with the semiconductor layer A, and are formed on some areas of the gate insulating layer 120. For convenience of description, only a driving thin film transistor among various thin film transistors that may be included in the light emitting display device 100 is illustrated, but a switching thin film transistor may also be included. In addition, in the specification, although the thin film transistor TFT is described as having a coplanar structure, a thin film transistor having an inverted staggered structure may also be used.

The semiconductor layer A may be formed of an oxide semiconductor or an amorphous semiconductor. The amorphous semiconductor may be formed of amorphous silicon. As another example, the semiconductor layer A may be formed of polycrystalline silicon that can be applied to the driving thin film transistor within the pixel since polycrystalline silicon has mobility superior than that of amorphous silicon and has low energy consumption and high reliability. However, the present disclosure is not limited thereto.

The passivation layer 130 is conformally disposed on an upper surface of the thin film transistor TFT. For example, the passivation layer 130 may be formed along a shape of the upper surface of the thin film transistor TFT. In addition, the passivation layer 130 may be formed to cover the thin film transistor TFT, and the passivation layer 130 may be disposed on a front surface of the lower substrate 110 on which the thin film transistor TFT is disposed. Further, with reference to FIG. 1, the passivation layer 130 is formed to overlap all of the plurality of sub-pixels SP.

In addition, the passivation layer 130 may be formed to have a thickness of 10 μm or less, for example, a thickness of 0.5 μm, but is not limited thereto.

As described above, the passivation layer 130 may be disposed to cover the thin film transistor TFT. The passivation layer 130 may protect the thin film transistor TFT from oxygen or moisture from the outside of the light emitting display device 100. Various organic or inorganic films may be used for the passivation layer 130, and the passivation layer 130 may be formed of various structures such as an organic film-alone deposition structure, an inorganic film-alone deposition structure, or a structure in which an organic film and an inorganic film are alternately disposed. The passivation layer 130 may be formed of, for example, silicon nitride (SiNx), silicon oxide (SiOx) or the like, but is not limited thereto.

The color filter CF may be disposed on the passivation layer 130 so as to overlap the light emitting area of the sub-pixel SP. In addition, since the color filter CF is disposed in the light emitting area of the sub-pixel SP, it is disposed on an upper layer of the thin film transistor TFT, but is disposed not to overlap the thin film transistor TFT.

In addition, each color filter CF may include a red color filter CF including a red pigment, a green color filter CF including a green pigment, and a blue color filter including a blue pigment to implement a color of the sub-pixel SP.

Also, to form the color filter CF, each of the red color filter CF, the green color filter CF, and the blue color filter CF needs to undergo processes such as a coating process, an exposure process, a development process, a post-bake process, and the like.

Among these processes, in the post-bake process, since a pigment layer for forming the color filter CF is heated, gases including hydrogen included in the pigment layer are discharged.

Despite of the post-bake process, hydrogen may remain in the color filter CF. Therefore, residual hydrogen included in the color filter CF can move inside the light emitting display device 100, and the residual hydrogen diffuses to the semiconductor layer A of the thin film transistor TFT, whereby characteristics of the thin film transistor TFT can be changed. For example, the semiconductor layer A may absorb hydrogen. When the semiconductor layer A absorbs hydrogen, a threshold voltage Vth of the thin film transistor TFT may be shifted to thereby increase mobility of the thin film transistor TFT. Accordingly, the characteristics of the thin film transistor TFT may be changed to thereby lower performance thereof, and defects such as the occurrence of speckles or bright spots and uneven luminance may occur. Accordingly, since hydrogen generated in a film-formation process of the color filter CF may degrade performance of the light emitting display device 100 as well as the performance of the thin film transistor TFT, it is necessary to remove residual hydrogen in the color filter CF.

The overcoating layer 150 is disposed on the gate insulating layer 120, the thin film transistor TFT, the passivation layer 130, and the color filter CF. For example, the overcoating layer 150 may be disposed on the front surface of the lower substrate 110 on which the gate insulating layer 120 and the passivation layer 130 are formed. More specifically, as illustrated in FIG. 2, one side end of the overcoating layer 150 may be disposed more inwardly than a side end of the lower substrate 110. However, the present disclosure is not limited thereto, and the side end of the overcoating layer 150 and the side end of the lower substrate 110 may be collinearly disposed.

In addition, the overcoating layer 150 may be formed to cover the thin film transistor TFT and the passivation layer 130, and may planarize upper portions of the thin film transistor TFT and the passivation layer 130. The overcoating layer 150 may be formed of an insulating material.

The light emitting element 140 including an anode 141, a light emitting layer 142, and a cathode 143, and the bank 160 are formed on the overcoating layer 150. For example, the anode 141 for supplying holes to the light emitting layer 142 is formed on an upper surface of the overcoating layer 150, the light emitting layer 142 is formed on the anode 141, and the cathode 143 for supplying electrons to the light emitting layer 142 is formed on the light emitting layer 142.

When the light emitting display device 100 is a bottom emission type, the anode 141 may include, for example, a transparent conductive layer formed of a transparent conductive oxide (Hereinafter, referred to as TCO), such as indium tin oxide (ITO), indium zinc oxide (IZO), ZnO or the like. In addition, the cathode 143 may be formed of a metallic material having low light transmittance.

When the light emitting display device 100 is a top emission type, the anode 141 may include a transparent conductive layer formed of a reflective layer and a transparent conductive oxide on the reflective layer. In addition, the cathode 143 may be formed by thinly forming a metallic material having a low work function, or may be formed of a transparent conductive oxide. When the cathode 143 is formed of a transparent conductive oxide, multiple layers may be disposed between the cathode 143 and the light emitting layer 142 so that electrons can move through the cathode 143. For example, a metal-doped layer may be disposed between the light emitting layer 142 and the cathode 143. Also, an organic buffer layer may be additionally disposed between the light emitting layer 142 and the metal-doped layer.

The bank 160 may be formed to cover a side portion of the anode 141 and may define the light emitting area of each sub-pixel SP.

For example, as illustrated in FIG. 2, the bank 160 may be formed to contact the overcoating layer 150 and cover both side portions of the anode 141. Accordingly, the bank 160 may block diffusion of moisture and impurities that may be introduced from the overcoating layer 150.

In addition, when the light emitting display device 100 is a top emission type, the bank 160 overlaps the thin film transistor TFT so that the thin film transistor TFT is not exposed to the outside. As a result, leakage photocurrent due to external light is not generated in the thin film transistor TFT and thus, the thin film transistor TFT can apply an appropriate driving current to the light emitting element 140.

In addition, the bank 160 may extend adjacent to the side end of the overcoating layer 150. For example, a side end of the bank 160 may be closer to the side end of the overcoating layer 150 than a boundary of the light emitting area of the sub-pixel SP. As illustrated in FIG. 2, the side end of the bank 160 may be disposed more inwardly than the side end of the overcoating layer 150.

In addition, the light emitting layer 142 and the cathode 143 may be disposed on the bank 160. In more detail, the light emitting layer 142 may be extended and disposed on the bank 160, and the cathode 143 may be disposed to cover an upper surface and a side surface of the light emitting layer 142 and an upper surface of the bank 160. However, as illustrated in FIG. 2, the light emitting layer 142 is not limited to extending only to the upper surface of the bank 160, but may also extend to a side surface of the bank 160.

In addition, the adhesive layer 170 may be formed to cover the light emitting element 140, the bank 160, and the overcoating layer 150. More specifically, the adhesive layer 170 may be disposed to cover an upper surface and a side surface of the cathode 143, the upper surface and the side surface of the bank 160, and only an upper surface of the overcoating layer 150. For example, the adhesive layer 170 may cover both an outer surface of the light emitting element 140 and an outer surface of the bank 160, but may not cover all of an outer surface of the overcoating layer 150.

In other words, a side end of the adhesive layer 170 may be disposed more inwardly than the side end of the overcoating layer 150, but may be disposed more outwardly than the side end of the bank 160. For example, the side end of the overcoating layer 150, the side end of the adhesive layer 170, and the side end of the bank 160 may be sequentially disposed based on an outside of the light emitting display device 100. More specifically, the side end of the bank 160 is disposed more inwardly than the side end of the adhesive layer 170, and the side end of the adhesive layer 170 is disposed more inwardly than the side end of the overcoating layer 150.

And, the adhesive layer 170 bonds the lower substrate 110 and the upper substrate 119 facing the lower substrate 110. Accordingly, the adhesive layer 170 may include an adhesive material. For example, the adhesive layer 170 may be formed of an adhesive material in a liquid form or a film form. For example, the adhesive layer 170 may be formed of a resin, epoxy, or acrylic material, but is not limited thereto.

Meanwhile, the passivation layer 130 is formed by chemical vapor deposition (CVD) using gases containing hydrogen (example, silane (SiH4) and ammonia (NH3)). Hydrogen may be generated in a film-formation process of the passivation layer 130, and the generated hydrogen may be diffused into the passivation layer 130 and included in the passivation layer 130. Here, the hydrogen may include hydrogen atoms (H) and hydrogen molecules (H2). For example, hydrogen remaining inside the passivation layer 130 may be diffused in a driving direction, and diffusion may be performed according to a concentration gradient, for example, chemical potential. Therefore, residual hydrogen included in the passivation layer 130 can move inside the light emitting display device 100, and the residual hydrogen diffuses to the semiconductor layer A of the thin film transistor TFT, thereby change characteristics of the thin film transistor TFT. For example, the semiconductor layer A may absorb hydrogen. When the semiconductor layer A absorbs hydrogen, the threshold voltage Vth of the thin film transistor TFT is shifted, whereby mobility of the thin film transistor TFT may increase. Accordingly, the characteristics of the thin film transistor TFT may be changed to thereby degrade performance thereof, and defects such as the occurrence of speckles or bright spots and uneven luminance may occur. Accordingly, since hydrogen generated in the film-formation process of the passivation layer 130 may degrade the performance of the light emitting display device 100 as well as the performance of the thin film transistor TFT, it is necessary to remove residual hydrogen in the passivation layer 130. In addition, the characteristics of the thin film transistor TFT may be changed due to the residual hydrogen in the passivation layer 130 according to a material of the upper substrate 119, so that bright spots may occur.

Accordingly, the hydrogen absorbing layer 180 may be disposed on the adhesive layer 170 in order to remove residual hydrogen included in the color filter CF and the passivation layer 130. For example, a side end of the hydrogen absorbing layer 180 and the side end of the adhesive layer 170 may be collinearly disposed.

Thus, the side end of the hydrogen absorbing layer 180 may also be disposed more inwardly than the side end of the overcoating layer 150, but may be disposed more outwardly than the side end of the bank 160. For example, the side end of the overcoating layer 150, the side ends of the adhesive layer 170 and the hydrogen absorbing layer 180, and the side end of the bank 160 may be sequentially disposed based on the outside of the light emitting display device 100. More specifically, the side end of the bank 160 is disposed more inwardly than the side ends of the adhesive layer 170 and the hydrogen absorbing layer 180, and the side ends of the adhesive layer 170 and the hydrogen absorbing layer 180 are disposed more inwardly than the side end of the overcoating layer 150. For example, since the overcoating layer 150 is disposed to cover all of the thin film transistor TFT, the gate insulating layer 120, and the passivation layer 130, diffusion of hydrogen by the passivation layer 130 may be prevented, and the diffused hydrogen may be absorbed by the hydrogen absorbing layer 180.

In addition, the hydrogen absorbing layer 180 is formed to have a thickness of 5000 angstroms (Å) or less and planarizes the upper surfaces of the overcoating layer 150, the bank 160, and the light emitting element 140. For example, the hydrogen absorbing layer 180 may be formed to have a maximum thickness of 50 μm, but is not limited thereto. In addition, the hydrogen absorbing layer 180 may be a sealing material, but is not limited to this term. The sealing material may be disposed on a front surface of the light emitting element.

The sealing material may be formed based on a curable resin. For example, the curable resin may be formed of a photocurable resin or a thermosetting resin. More specifically, the curable resin may be an epoxy resin or a polyolefin resin, but is not limited thereto.

In addition, a side seal member may be further included on one side surface of the overcoating layer 150, one side surfaces of the adhesive layer 170 and the hydrogen absorbing layer 180, and one side surface of the upper substrate 119. The side seal member borders a side portion of the light emitting display device 100. For example, the side seal member may contact one side surface of the overcoating layer 150, one side surfaces of the adhesive layer 170 and the hydrogen absorbing layer 180, and one side surface of the upper substrate 119. And, the side seal member can minimize moisture permeation in the side portion. To this end, the side seal member may be formed of, for example, a curable material such as an acrylic curable material, a urethane curable material, and a silicon curable material, but is not limited thereto.

The hydrogen absorbing layer 180 described above may include a hydrogen absorbing filler that serves as a filter by adsorbing or absorbing hydrogen, for example, hydrogen atoms (H) and hydrogen molecules (H2), or moisture, in order to absorb residual hydrogen in the color filter CF and/or the passivation layer 130. The filler may be a powder, but is not limited to this term. For example, the hydrogen absorbing filler can be an inorganic material or an organic material.

As the hydrogen absorbing filler, the inorganic material may include one or more of a metal, a mixture including the metal, and a compound including the metal. For example, the hydrogen absorbing layer 180 may be configured to include a metal, a mixture of a metal, a compound of a metal, a metal and a mixture of the metal, a metal and a compound of the metal, a mixture of a metal and a compound of the metal, or a metal, a mixture of the metal and a compound of the metal. Here, the metal may include one or more of an alkali metal, an alkaline earth metal, a rare earth metal, a titanium (Ti) group metal, a transition metal, and a post-transition metal. Further, the metal may be particles having a diameter of several to several tens of nanometers (nm). For example, the metal may be particles having a diameter of 100 nm or less, but is not limited thereto.

The inorganic material of the hydrogen absorbing layer 180 can absorb hydrogen in various ways. For example, the inorganic material of the hydrogen absorbing layer 180 may absorb hydrogen through a chemical reaction or trap hydrogen in a gap between inorganic materials to absorb it.

The inorganic material of the hydrogen absorbing layer 180 reacts with the residual hydrogen in the color filter CF and the passivation layer 130 to produce a hydrogen compound. Accordingly, the hydrogen compound obtained by reacting the inorganic material of the hydrogen absorbing layer 180 with the residual hydrogen in the color filter CF and the passivation layer 130 may be included in the hydrogen absorbing layer 180. For example, the hydrogen absorbing layer 180 may include the hydrogen compound as well as an inorganic material. The hydrogen compound generated in the hydrogen absorbing layer 180 may be formed through reaction as in the following [Reaction Formula 1].

$$Me+(X/2)H_2 \rightarrow MeH_x \qquad \text{[Reaction Formula 1]}$$

Reaction Formula 1 is a chemical reaction formula for explaining a process of producing a hydrogen compound (MeHx) by reacting the inorganic material of the hydrogen absorbing layer 180 with the residual hydrogen. Here, Me means a metal. However, not only a metal, but also a metal compound or a metal mixture may react with hydrogen as described in [Reaction Formula 1] to thereby form a hydrogen compound.

Therefore, when the inorganic material of the hydrogen absorbing layer 180 reacts with the residual hydrogen in the color filter CF and the passivation layer 130 to produce a hydrogen compound, energy is generated or absorbed, and such energy can be called hydrogen adsorption energy.

In this regard, Table 1 describes the hydrogen adsorption energy according to a type of metal when the temperature is 298K. In connection with this, in a case in which the hydrogen adsorption energy has a positive number, it means that when a metal which is an inorganic material, and hydrogen are adsorbed, they react spontaneously while generating heat. In a case in which the hydrogen adsorption energy has a negative number, it means that when a metal which is an inorganic material, and hydrogen are adsorbed, they react involuntarily while absorbing heat.

TABLE 1

| Metal Type | Hydrogen Adsorption Energy [eV] |
|---|---|
| Vanadium (V) | −0.08 |
| Nickel (Ni) | 0.02 |
| Palladium (Pd) | 0.05 |
| Copper (Cu) | −0.05 |
| Iron (Fe) | −0.01 |

For example, since hydrogen adsorption reactions occur more spontaneously in the order of lower hydrogen adsorption energy, the hydrogen adsorption reactions occur better in the order of vanadium (V), copper (Cu), iron (Fe), nickel (Ni), and palladium (Pd).

However, in Table 1, the hydrogen adsorption energy when the temperature is 298K is described. Thus, the hydrogen adsorption energy may be further reduced as compared to those described in Table 1, since a process temperature is higher than 300K.

For example, the inorganic material included in the hydrogen absorbing layer 180 may include one or more of metals such as thorium (Th), zirconium (Zr), vanadium (V), palladium (Pd), titanium (Ti), magnesium (Mg), nickel (Ni), tin (Sn), platinum (Pt), chromium (Cr), silver (Ag), aluminum (Al), copper (Cu), gold (Au), cobalt (Co), iron (Fe) and the like, or lanthanum-nickel (La—Ni), lanthanum-nickel-aluminum (La—Ni—Al), nickel-magnesium (Ni—Mg), iron-titanium (Fe—Ti), and titanium-manganese (Ti—Mn), but is not limited thereto.

As the hydrogen absorbing filler, the organic material may include one or more of a hydroxy benzophenone-based compound, a hydroxy phenylbenzotriazole-based compound, and a hindered amines-based compound. For example, the organic material of the hydrogen absorbing layer 180 may be a HALS (hindered amine light stabilizer) represented by the following Chemical Formula 1, but is not limited thereto.

[Chemical Formula 1]

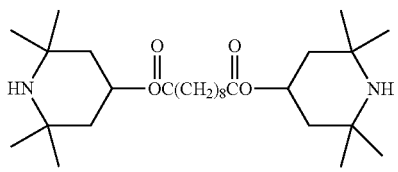

The organic material can directly combine with hydrogen through a chemical reaction and absorb hydrogen.

The semiconductor layer A included in the light emitting display device according to an exemplary aspect of the present disclosure may be formed of an oxide semiconductor. The oxide semiconductor has excellent mobility and uniformity. For example, the oxide semiconductor may have a semiconductor layer formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, an tin gallium zinc oxide (SnGaZnO)-based material, an aluminum gallium zinc oxide (AlGaZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, and a zinc oxide (ZnO)-based material. Composition ratios of respective elements included in the oxide semiconductor are not limited.

In this manner, when the semiconductor layer A is an oxide semiconductor, since the residual hydrogen included in the color filter CF and the passivation layer 130 diffuses to the semiconductor layer A composed of an oxide semiconductor, an electron concentration may increase due to reduction of the semiconductor layer A composed of an oxide semiconductor. As a result, a channel through which an unintended leakage current can flow may be formed in the semiconductor layer A formed of an oxide semiconductor, due to an increased electron concentration, so that a bright spot may be generated. Accordingly, the light emitting display device according to an exemplary aspect of the present disclosure removes the residual hydrogen included in the color filter CF and the passivation layer 130 to thereby solve problems that occur due to the semiconductor layer A composed of an oxide semiconductor. For example, even if hydrogen is diffused from the color filter CF and the passivation layer 130, the diffused hydrogen is absorbed by the hydrogen absorbing filler of the hydrogen absorbing layer 180 and does not influence the semiconductor layer A composed of an oxide semiconductor. Therefore, the light emitting display device 100 can prevent a reduction in performance of the thin film transistor TFT due to residual hydrogen moving through the hydrogen absorbing layer 180, reduce the occurrence of speckles and bright spots, and reduce uneven luminance.

The upper substrate 119 may be, for example, a metal, plastic film, and glass, but is not limited thereto. The metal may be, for example, iron-nickel (Fe—Ni), but is not limited thereto. Therefore, even if a material of the upper substrate 119 is changed, defects such as bright spots and the like due to residual hydrogen can be reduced, so that the degree of freedom of the material of the upper substrate 119 can be improved.

The hydrogen absorbing filler in the hydrogen absorbing layer 180 may transmit light incident onto the hydrogen absorbing layer 180. For example, the hydrogen absorbing layer 180 may have a transmittance of 50% or more with respect to light incident onto the hydrogen absorbing layer 180. For example, the hydrogen absorbing layer 180 may have a transmittance of 70% or more with respect to light incident onto the hydrogen absorbing layer 180. Light-transmissive characteristics of the hydrogen absorbing layer 180 may be advantageous in securing transmittance and improving luminous efficiency of a top emission type light emitting display device.

In some aspects, the hydrogen absorbing layer 180 may further include a getter, together with the hydrogen absorbing filler that absorbs hydrogen. The getter may be a particle that absorbs moisture and gas.

Further, in some aspects, the hydrogen absorbing filler that absorbs hydrogen may be included even in the overcoating layer 150 disposed on the thin film transistor TFT, and the bank 160 and the adhesive layer 170 disposed on the overcoating layer 150.

The overcoating layer 150 and the bank 160 also include a hydrogen absorbing filler that absorbs hydrogen, so that the hydrogen absorbing filler included in the overcoating layer 150 and the bank 160 absorbs hydrogen through a chemical reaction, or hydrogen absorbing fillers trap hydrogen in a gap therebetween so that hydrogen can be absorbed.

Accordingly, residual hydrogen moving from the passivation layer 130 to the thin film transistor TFT can be more efficiently absorbed, and a degradation in performance of the thin film transistor TFT due to the moving residual hydrogen can be effectively prevented.

Figure 3:
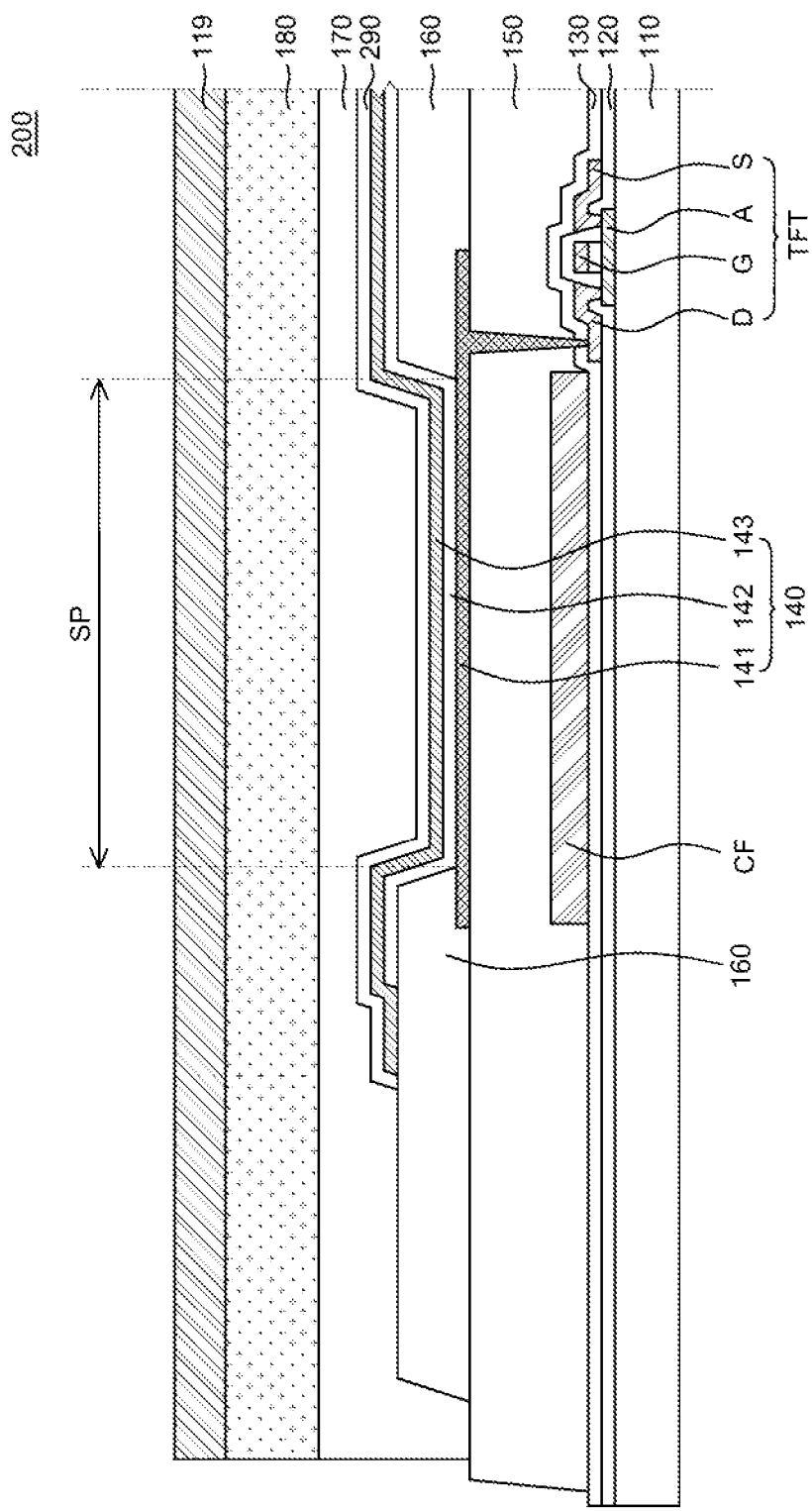
FIG. 3 is a cross-sectional view of one sub-pixel of a light emitting display device according to still another exemplary aspect of the present disclosure.

FIG. 3 is a cross-sectional view of one sub-pixel of a light emitting display device according to another exemplary aspect of the present disclosure. A light emitting display device 200 of FIG. 3 is different from the light emitting display device 100 of FIG. 2 in terms of an upper protective layer 290, and other components thereof are substantially the same as those of the light emitting display device 100 of FIG. 2. Thus, a duplicate description is omitted.

With reference to FIG. 3, the upper protective layer 290 covers the light emitting element 140 to protect the light emitting element 140. As illustrated in FIG. 2, the upper protective layer 290 is conformally disposed on an upper surface of the cathode 143 of the light emitting element 140. For example, the upper protective layer 290 may be formed along shapes of the upper surface and the side surface of the cathode 143, but is not limited thereto. The upper protective layer 290 may extend to the upper surface and the side surface of the bank 160.

In addition, various organic films or inorganic films may be used for the upper protective layer 290, and the upper protective layer 290 may be formed of various structures such as an organic film-alone deposition structure, an inorganic film-alone deposition structure, or a structure in which an organic film and an inorganic film are alternately disposed. The upper protective layer 290 may be formed of, for example, silicon nitride (SiNx), silicon oxide (SiOx) or the like, but is not limited thereto.

Accordingly, in another exemplary aspect of the present disclosure, damage to the light emitting element 140 due to moisture or foreign matter can be prevented by further including the upper protective layer 290 for protecting the light emitting element 140. Accordingly, element reliability of the light emitting display device 200 according to another exemplary aspect of the present disclosure may be significantly improved.

Figure 4:
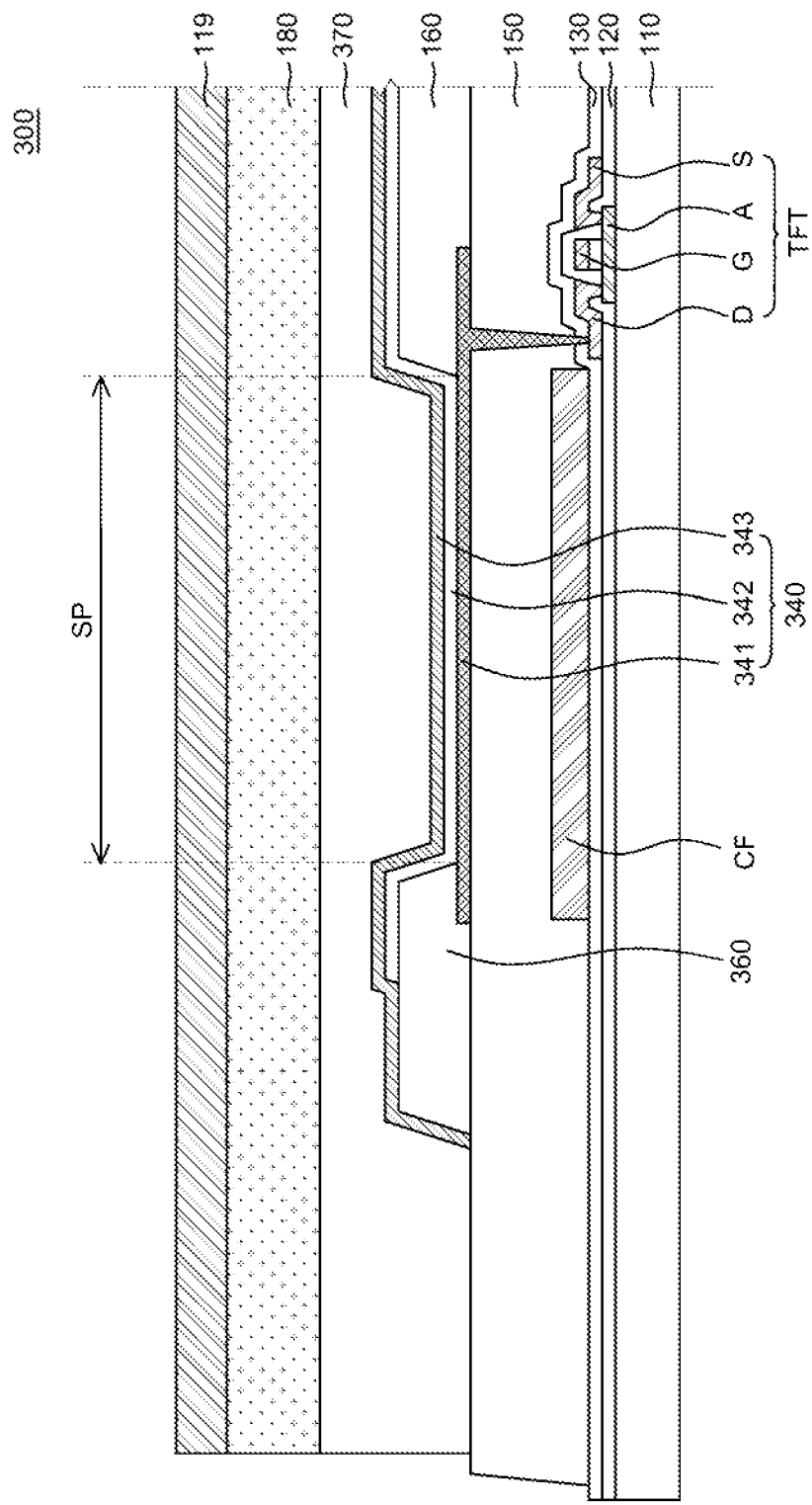
FIG. 4 is a cross-sectional view of one sub-pixel of a light emitting display device according to still another exemplary aspect of the present disclosure.

FIG. 4 is a cross-sectional view of one sub-pixel of a light emitting display device according to still another exemplary aspect of the present disclosure. A light emitting display device 300 of FIG. 4 is different from the light emitting display device 100 of FIG. 2 in terms of a disposition relationship of a light emitting element 340, a bank 360, and an adhesive layer 370, and other components thereof are substantially the same as those of the light emitting display device 100 of FIG. 2. Thus, a duplicate description is omitted.

As illustrated in FIG. 4, the bank 360 may extend between the light emitting area of the sub-pixel SP and the side end of the overcoating layer 150. For example, a side end of the bank 360 may be disposed between a boundary of the light emitting area of the sub-pixel SP and the side end of the overcoating layer 150. As illustrated in FIG. 4, the side end of the bank 360 may be disposed more inwardly than the side end of the overcoating layer 150.

In addition, a light emitting layer 342 and a cathode 343 may be disposed on the bank 360. More specifically, the light emitting layer 342 may be disposed to extend on the bank 360, and the cathode 343 may be disposed to cover a side surface of the light emitting layer 342 and an upper surface and a side surface of the bank 360. However, as illustrated in FIG. 4, the light emitting layer 342 is not limited to extending only to the upper surface of the bank 360, but may also extend to the side surface of the bank 360.

In addition, the adhesive layer 370 may be formed to cover the light emitting element 340, the bank 360, and the overcoating layer 150. More specifically, the adhesive layer 370 may be disposed to cover an upper surface and a side surface of the cathode 343, the upper surface and the side surface of the bank 360, and only the upper surface of the overcoating layer 150. For example, the adhesive layer 370 covers both an outer surface of the light emitting element 340 and an outer surface of the bank 360, but may not cover all of an outer surface of the overcoating layer 150.

In other words, a side end of the adhesive layer 370 may be disposed more inwardly than the side end of the overcoating layer 150, but may be disposed more outwardly than the side end of the bank 360. For example, the side end of the overcoating layer 150, the side end of the adhesive layer 370, and the side end of the bank 360 may be sequentially disposed based on an outside of the light emitting display device 300. For example, since the overcoating layer 150 is disposed to cover all of the thin film transistor TFT, the gate insulating layer 120, and the passivation layer 130, adhesion between the overcoating layer 150 and the adhesive layer 170 may be improved as compared to adhesion between the gate insulating layer 120 and the passivation layer 130 and the adhesive layer 170.

In addition, in the light emitting display device 100 according to another exemplary aspect of the present disclosure, the side end of the adhesive layer 370 may be disposed closer to the side end of the overcoating layer 150 than the side end of the bank 360. For example, a distance between the side end of the adhesive layer 370 and the side end of the overcoating layer 150 may be shorter than a distance between the side end of the adhesive layer 370 and the side end of the bank 360.

Figure 5:
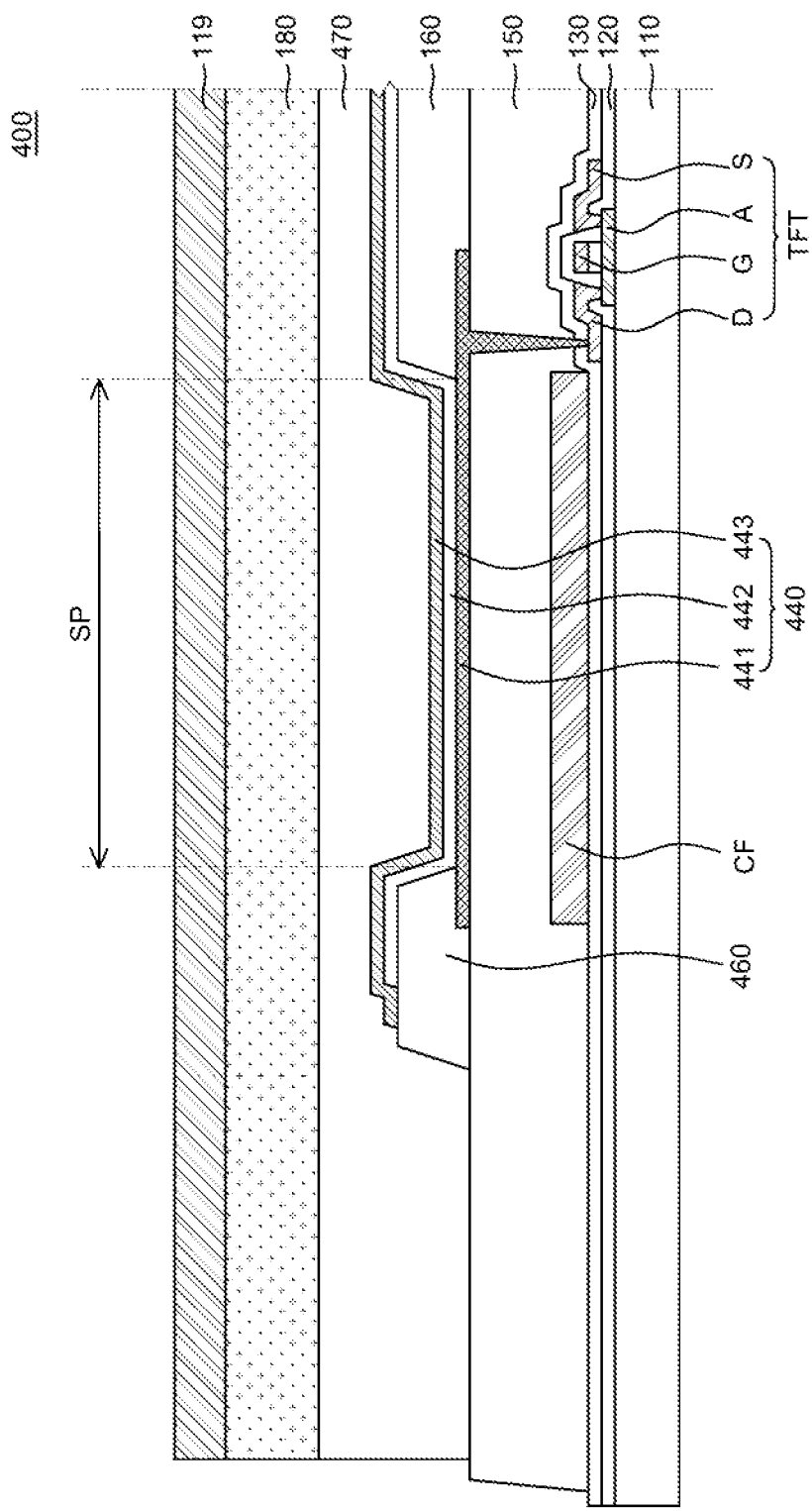
FIG. 5 is a cross-sectional view of one sub-pixel of a light emitting display device according to still another exemplary aspect of the present disclosure.

FIG. 5 is a cross-sectional view of one sub-pixel of a light emitting display device according to still another exemplary aspect of the present disclosure. A light emitting display device 400 of FIG. 5 is different from the light emitting display device 100 of FIG. 2 in terms of a disposition relationship of a light emitting element 440, a bank 460, and an adhesive layer 470, and other components thereof are substantially the same as those of the light emitting display device 100 of FIG. 2. Thus, a duplicate description is omitted.

As illustrated in FIG. 5, the bank 460 may be disposed only in an area adjacent to the light emitting area of the sub-pixel SP. For example, a side end of the bank 460 may be disposed closer to the boundary of the light emitting area of the sub-pixel SP than the side end of the overcoating layer 150. As illustrated in FIG. 5, the side end of the bank 460 may be disposed more inwardly than the side end of the overcoating layer 150.

In addition, a light emitting layer 442 and a cathode 443 may be disposed on the bank 460. More specifically, the light emitting layer 442 may be disposed to extend on the bank 460, and the cathode 443 may be disposed to cover an upper surface and a side surface of the light emitting layer 442, and only an upper surface of the bank 460. As illustrated in FIG. 2, the light emitting layer 442 is not limited to extending only to the upper surface of the bank 460, but may also extend to a side surface of the bank 460.

In addition, the adhesive layer 470 may be formed to cover the light emitting element 440, the bank 460, and the overcoating layer 150. More specifically, the adhesive layer 470 may be disposed to cover an upper surface and a side surface of the cathode 443, the upper surface and the side surface of the bank 460, and only the upper surface of the overcoating layer 150. For example, the adhesive layer 470 covers both an outer surface of the light emitting element 440 and an outer surface of the bank 460, but may not cover all of the outer surface of the overcoating layer 150.

In other words, a side end of the adhesive layer 470 may be disposed more inwardly than the side end of the overcoating layer 150, but may be disposed more outwardly than the side end of the bank 460. For example, the side end of the overcoating layer 150, the side end of the adhesive layer 470, and the side end of the bank 460 may be sequentially disposed based on an outside of the light emitting display device 400.

In addition, in the light emitting display device 400 according to still another exemplary aspect of the present disclosure, the side end of the adhesive layer 470 may be disposed closer to the side end of the overcoating layer 150 than the side end of the bank 460. For example, a distance between the side end of the adhesive layer 470 and the side end of the overcoating layer 150 may be shorter than a distance between the side end of the adhesive layer 470 and the side end of the bank 460.

Figure 6:
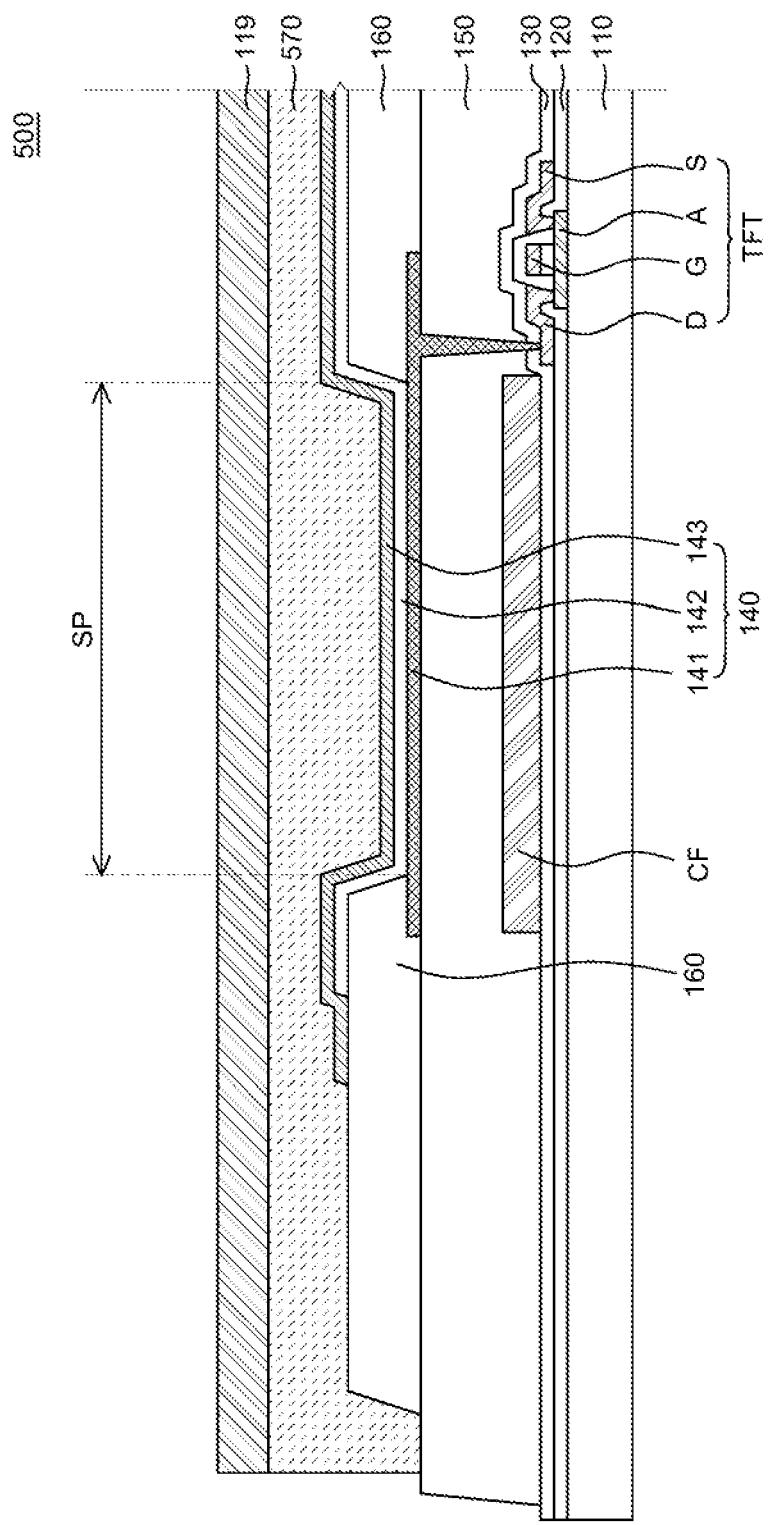
FIG. 6 is a cross-sectional view of one sub-pixel of a light emitting display device according to still another exemplary aspect of the present disclosure.

FIG. 6 is a cross-sectional view of one sub-pixel of a light emitting display device according to still another exemplary aspect of the present disclosure. A light emitting display device 500 of FIG. 6 is different from the light emitting display device 100 of FIG. 2 in that an adhesive layer 570 has a different structure without a separate hydrogen absorbing layer, and other components thereof are substantially the same as those of the light emitting display device 100 of FIG. 2. Thus, a duplicate description is omitted.

As illustrated in FIG. 6, the adhesive layer 570 is disposed between the light emitting element 140 and the upper substrate 119. Specifically, the adhesive layer 570 may be formed to cover the light emitting element 140, the bank 160, and the overcoating layer 150 that are positioned thereunder, and may bond components disposed thereunder and the upper substrate 119 positioned thereon. In the light emitting display device 500 according to still another exemplary aspect of the present disclosure, as compared to the light emitting display device 100 of FIG. 2, a separate hydrogen absorbing layer is not disposed on the adhesive layer 570, and the upper substrate 119 is directly positioned on the adhesive layer 570.

The adhesive layer 570 simultaneously includes an adhesive material and a hydrogen absorbing filler.

The adhesive material may be formed of an adhesive material in a liquid form or a film form, and may be formed of, for example, a resin, epoxy, or acrylic material, but is not limited thereto.

The hydrogen absorbing filler serves as a filter by absorbing or adsorbing hydrogen in order to absorb residual hydrogen in the color filter CF and/or the passivation layer 130. The hydrogen absorbing filler may be an inorganic material or an organic material, and since it is substantially the same as the hydrogen absorbing filler described in FIG. 2, a duplicate description thereof is omitted.

Since the adhesive layer 570 includes a hydrogen absorbing filler, residual hydrogen included in the color filter CF and the passivation layer 130 can be removed. That is, the adhesive layer 570 may simultaneously perform a function of bonding the lower substrate 110 and the upper substrate 119 and a function of removing hydrogen inside the light emitting display device 500.

In the light emitting display device 500 according to another exemplary aspect of the present disclosure, a separate function of removing hydrogen inside the light emitting display device 500, like the hydrogen absorbing layer, can be removed through the adhesive layer 570 that simultaneously performs an adhesion function and a hydrogen removal function. Thus, an overall thickness of the light emitting display device can be reduced.

Figure 7:
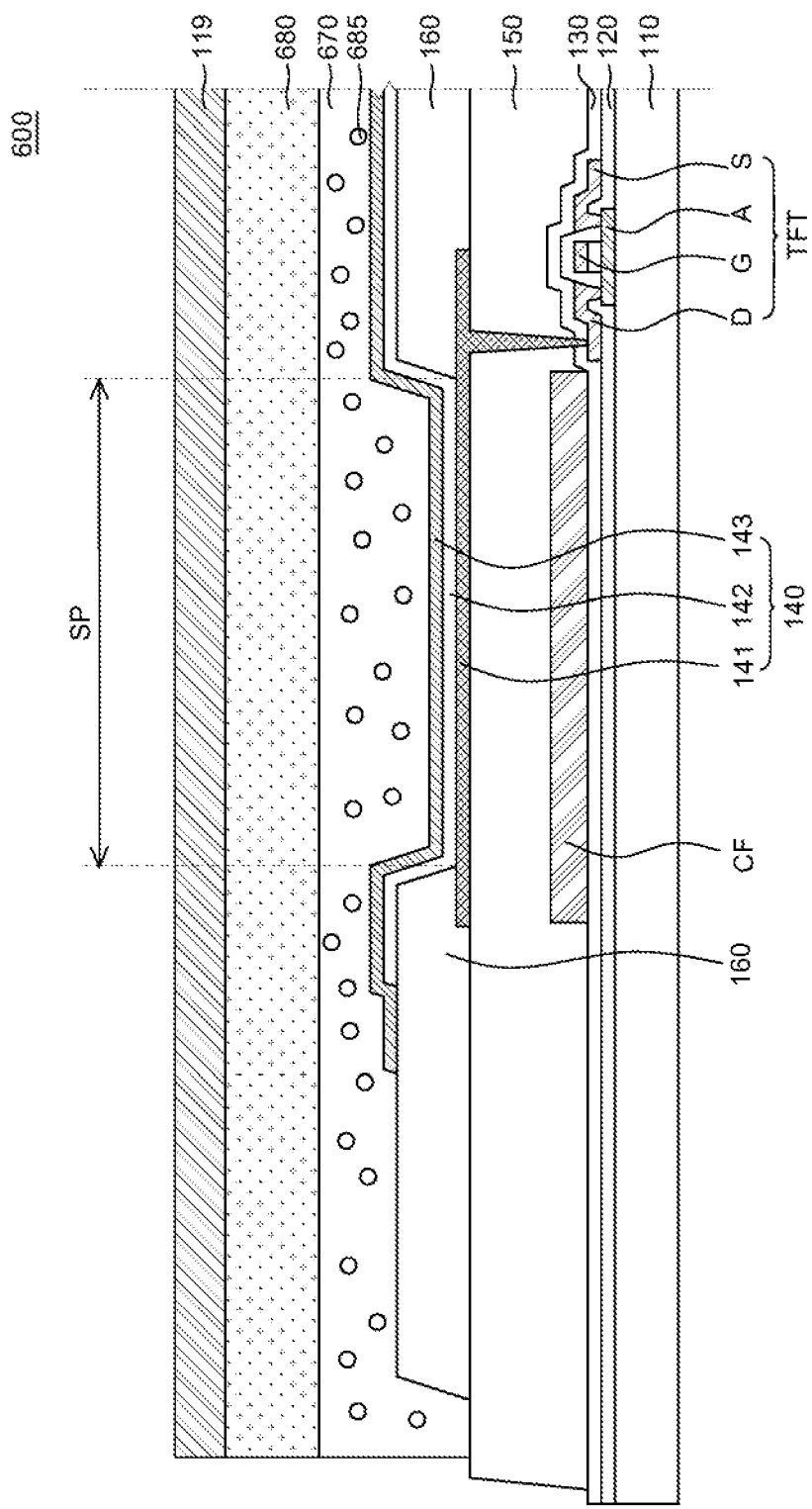
FIG. 7 is a cross-sectional view of one sub-pixel of a light emitting display device according to still another exemplary aspect of the present disclosure.

FIG. 7 is a cross-sectional view of one sub-pixel of a light emitting display device according to still another exemplary aspect of the present disclosure. A light emitting display device 600 of FIG. 7 is different from the light emitting display device 100 of FIG. 2 in terms of a configuration of an adhesive layer 670, and other components thereof are substantially the same as those of the light emitting display device 100 of FIG. 2. Thus, a duplicate description is omitted.

As illustrated in FIG. 7, the adhesive layer 670 is disposed on the light emitting element 140. The adhesive layer 670 may be formed to cover the light emitting element 140, the bank 160, and the overcoating layer 150 that are positioned thereunder, and may bond components thereunder and the upper substrate 119 positioned thereon.

The adhesive layer 670 simultaneously includes an adhesive material and an organic material 685 as a hydrogen absorbing filler.

Specifically, the adhesive material may be formed of an adhesive material in a liquid form or a film form, and may be formed of, for example, a resin, epoxy, or acrylic material, but is not limited thereto.

As the hydrogen absorbing filler, the organic material 685 of the adhesive layer 670 may include one or more of a hydroxy benzophenone-based compound, a hydroxy phenylbenzotriazole-based compound, and a hindered amines-based compound.

Since the adhesive layer 670 includes the hydrogen absorbing filler formed of the organic material 685, the residual hydrogen included in the color filter CF and the passivation layer 130 can be removed. That is, the adhesive layer 670 may simultaneously perform the function of bonding the lower substrate 110 and the upper substrate 119 and the function of removing hydrogen inside the light emitting display device 600.

A hydrogen absorbing layer 680 is disposed on the adhesive layer 670 in order to remove residual hydrogen included in the color filter CF and the passivation layer 130. The hydrogen absorbing layer 680 includes a sealing material and an inorganic material as a hydrogen absorbing filler. With the exception that the hydrogen absorbing layer 680 in the light emitting display device 600 of FIG. 7 includes an inorganic material as a hydrogen absorbing filler, the hydrogen absorbing layer 680 is substantially the same as the hydrogen absorbing layer 180 described in FIG. 2. Thus, a duplicate description is omitted.

In the light emitting display device 600 according to another exemplary aspect of the present disclosure, the adhesive layer 670 includes the hydrogen absorbing filler of the organic material 685, and the hydrogen absorbing layer 680 disposed on the adhesive layer 670 includes the hydrogen absorbing filler of an inorganic material.

By sequentially stacking the adhesive layer 670 including the hydrogen absorbing filler of the organic material 685 and the hydrogen absorbing layer 680 including the hydrogen absorbing filler of the inorganic material, the layers performing the hydrogen absorbing function can be implemented as a double layer, so that the residual hydrogen included in the color filter CF and the passivation layer 130 can be more easily removed.

In particular, when the hydrogen absorbing filler of the organic material 685 is included in the adhesive layer 670 positioned under the hydrogen absorbing layer 680, the hydrogen absorbing filler of the organic material 685 has excellent dispersibility to an adhesive composition, so that it can be disposed on the light emitting element 140 without an aggregation phenomenon. When the hydrogen absorbing filler of the inorganic material is disposed adjacent to the thin film transistor TFT or the passivation layer 130, optical properties of the light emitting display device may be degraded due to aggregation between the inorganic materials. In addition, since the inorganic material may damage the thin film transistor TFT or the passivation layer 130, durability or light emission characteristics of the light emitting display device may be degraded.

Therefore, as in the light emitting display device of FIG. 7, by disposing the adhesive layer including the hydrogen absorbing filler of an organic material on the passivation layer and then, disposing the hydrogen absorbing layer including the hydrogen absorbing filler of an inorganic material on the adhesive layer, the performance of removing hydrogen inside the light emitting display device may be improved without lowering durability or light emission characteristics of the light emitting display device.

Figure 8:
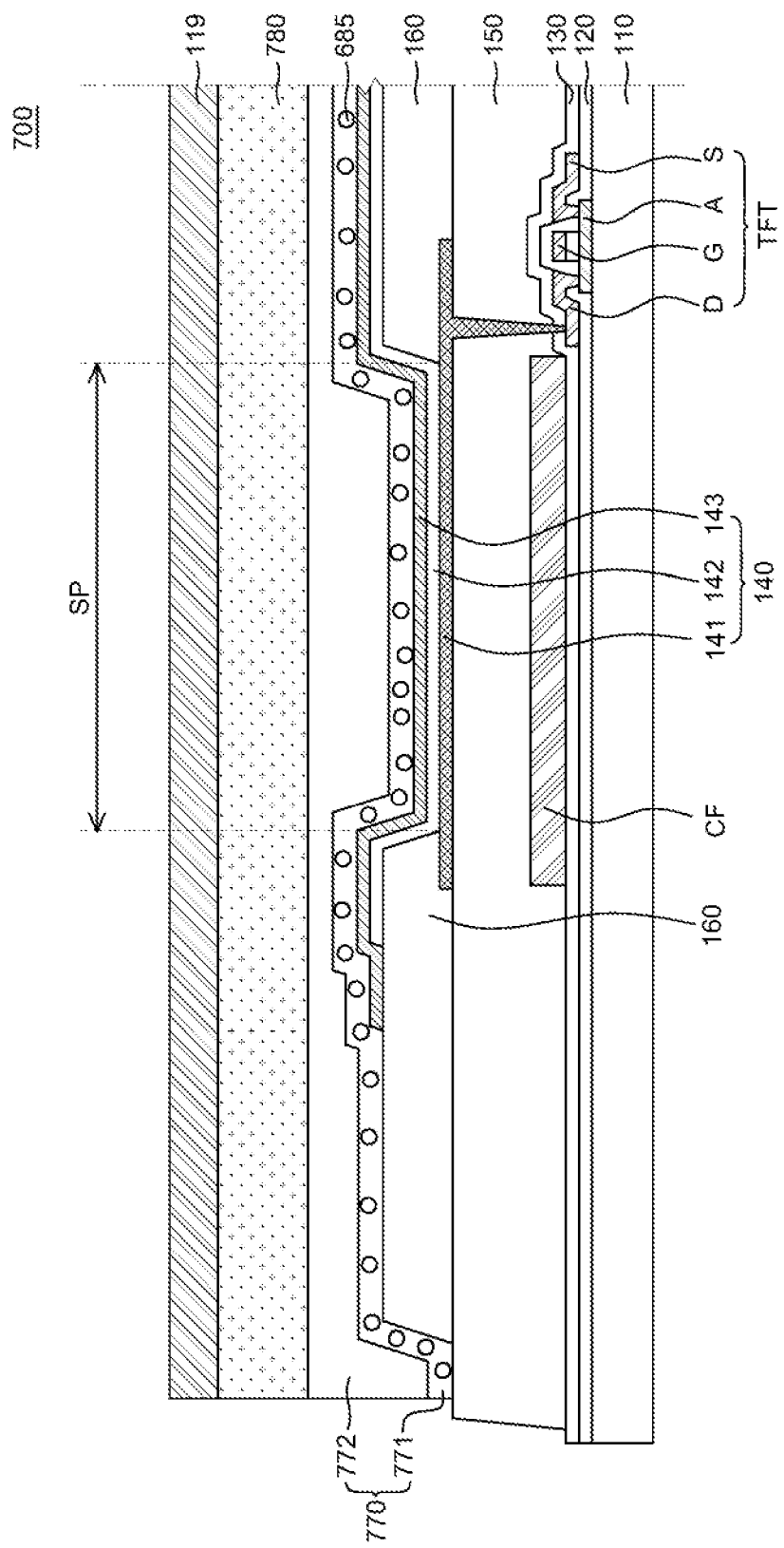
FIG. 8 is a cross-sectional view of one sub-pixel of a light emitting display device according to still another exemplary aspect of the present disclosure.

FIG. 8 is a cross-sectional view of one sub-pixel of a light emitting display device according to still another exemplary aspect of the present disclosure. A light emitting display device 700 of FIG. 8 is different from the light emitting display device 600 of FIG. 7 in terms of a configuration of an adhesive layer 770, and other components thereof are substantially the same as those of the light emitting display device 600 of FIG. 7. Thus, a duplicate description is omitted.

As illustrated in FIG. 8, the adhesive layer 770 is disposed on the light emitting element 140. The adhesive layer 770 may be formed to cover the light emitting element 140, the bank 160, and the overcoating layer 150 that are disposed thereunder, and may bond components thereunder and the upper substrate 119 positioned thereon.

The adhesive layer 770 includes a first adhesive layer 771 and a second adhesive layer 772 disposed on the first adhesive layer 771.

The first adhesive layer 771 may be formed to cover the light emitting element 140, the bank 160, and the overcoating layer 150 positioned thereunder. The first adhesive layer 771 simultaneously includes an adhesive material and a hydrogen absorbing filler of the organic material 685. The second adhesive layer 772 is disposed on the first adhesive layer 771 and is formed of only an adhesive material without a hydrogen absorbing filler.

A hydrogen absorbing layer 780 including a hydrogen absorbing filler of an inorganic material and a sealing material is disposed on the adhesive layer 770.

The light emitting display device 700 according to another exemplary aspect of the present disclosure has a structure in which the hydrogen absorbing filler of the organic material 685 is disposed only in a lower area of the adhesive layer 770. That is, unlike the light emitting display device 600 of FIG. 7 having a structure in which the hydrogen absorbing filler of the organic material 685 is dispersed in the entire area of the adhesive layer 670, the hydrogen absorbing filler of the organic material 685 is disposed only in the lower area of the adhesive layer 770, that is, only in the first adhesive layer 771, so as to be adjacent to the thin film transistor and the passivation layer 130. The hydrogen absorbing filler of the organic material 685 is positioned close to the thin film transistor TFT, so that diffusion of hydrogen generated from moisture during a manufacturing process of a light emitting panel can be quickly controlled in a surface of the thin film transistor TFT.

Figure 9:
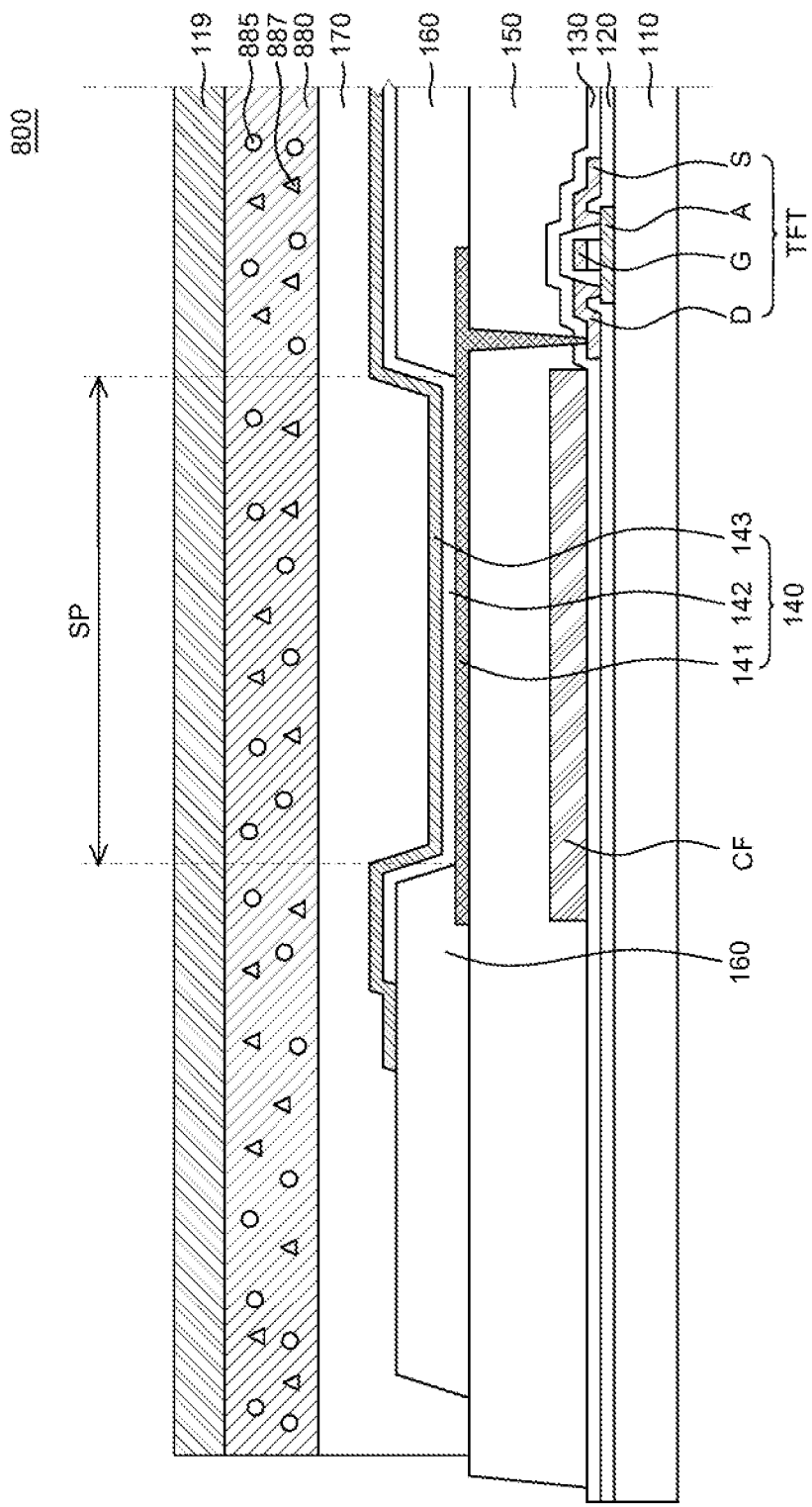
FIG. 9 is a cross-sectional view of one sub-pixel of a light emitting display device according to still another exemplary aspect of the present disclosure.

FIG. 9 is a cross-sectional view of one sub-pixel of a light emitting display device according to still another exemplary aspect of the present disclosure. Since other components of a light emitting display device 800 of FIG. 9 are substantially the same as those of the light emitting display device 100 of FIG. 2, with the exception that an oxygen absorbing layer 880 instead of the hydrogen absorbing layer 180 is disposed. Thus, a duplicate description is omitted.

As shown in FIG. 9, in the light emitting display device 800 of FIG. 9, an oxygen absorbing layer 880 is disposed on the adhesive layer 170. The oxygen absorbing layer 880 removes oxygen included in the light emitting display device 800.

Specifically, when manufacturing the light emitting display device 800 by disposing the upper substrate 119 above the lower substrate 110, external oxygen may be injected into the light emitting display device. In particular, external oxygen may move into the display device through a moisture-permeable prevention filler included in an organic material layer inside the light emitting display device used to prevent moisture permeation. Oxygen injected into the light emitting display device reacts with the organic material or the cathode constituting the light emitting element, and thus, a bright spot such as a white point or a dark point occurs, resulting in non-uniform luminance. Accordingly, defects of white spots can be solved by removing the oxygen inside the light emitting display device 800 through the oxygen absorbing layer 880.

The oxygen absorbing layer 880 may include a sealing material and an oxygen absorbing filler 887.

The sealing material may be formed based on a curable resin. For example, the curable resin may be a transparent thermosetting resin or a photocurable resin. For example, the curable resin may be an epoxy resin or an olefin resin.

At this time, the curable resin may have a polar group or a hydroxyl group. For example, the curable resin includes polyvinyl alcohol (PVA), polyvinylidene chloride (PVDC), ethylene vinyl alcohol (EVOH), polyacrylonitrile (PAN), polychlorotrifluoroethylene (PCTFE) or a combination thereof. In the case of a polymer having a polar group as a base material constituting the oxygen absorbing layer 880, gas permeability is low and barrier property tends to be high, so that the amount of oxygen input from the outside to the inside of the light emitting display device 800 may decrease.

The oxygen absorbing filler 887 adsorbs or removes oxygen atoms or oxygen molecules through physical or chemical reactions. For example, the oxygen absorbing filler 887 may be an organic material or an inorganic material.

The oxygen absorbing filler 887 of the organic material may be carbon nano tube (CNT) or graphene, but is not limited thereto.

In addition, the oxygen absorbing filler 887 of the organic material may be an antioxidant such as a hindered phenyl-based compound, for example, IRGAFOS XP40, IRGAFOS XP60, IRGANOX 1010, IRGANOX 1035, IRGANOX 1076, IRGANOX 1135, or IRGANOX 1520L (which are trade names, manufactured by BASF), but is not limited thereto.

The oxygen absorbing filler 887 of the inorganic material may be any one or more of silica, zeolite, titania, zirconia, and montmorillonite, but is not limited thereto.

Meanwhile, the oxygen absorbing filler 887 of the inorganic material may be a surface-modified particle. For example, various coupling agents such as vinyl-based, glycidoxy-based, methacryl-based, amino-based, and mercapto-based silane coupling agents or alkoxide-based, chelating-based, and acylate-based titanium coupling agents may be used for a surface of a silica particle.

A surface treatment method of the silica particle may be performed by, for example, a stirring method, a wetting method, a drying method, or the like, but is not limited thereto.

Meanwhile, in the light emitting display device 800 of FIG. 9, the oxygen absorbing layer 880 may further include a hydrogen absorbing filler 885. At this time, the oxygen absorbing layer 880 may include a sealing material, the oxygen absorbing filler 887 and the hydrogen absorbing filler 885, absorb hydrogen remaining inside the light emitting display device 800, and absorb or block oxygen injected from the outside of the light emitting display device 800. In FIG. 9, although the oxygen absorbing layer 880 is illustrated to simultaneously include the oxygen absorbing filler 887 and the hydrogen absorbing filler 885, the oxygen absorbing layer 880 may include only the oxygen absorbing filler 887 without the hydrogen absorbing filler as described above.

In the light emitting display device 800 of FIG. 9, a structure of the oxygen absorbing layer 880 may be substantially the same as the hydrogen absorbing layer 180 of the light emitting display device 100 of FIG. 2. Specifically, a side end of the oxygen absorbing layer 880 and the side end of the adhesive layer 170 may be collinearly disposed. Accordingly, the side end of the oxygen absorbing layer 880 may also be disposed more inwardly than the side end of the overcoating layer 150, but may be disposed more outwardly than the side end of the bank 160. For example, the side end of the overcoating layer 150, the side ends of the adhesive layer 170 and the oxygen absorbing layer 880, and the side end of the bank 160 may be sequentially disposed on an outside of the light emitting display device 800. More specifically, the side end of the bank 160 may be disposed more inwardly than the side ends of the adhesive layer 170 and the oxygen absorbing layer 880, and the side ends of the adhesive layer 170 and the oxygen absorbing layer 880 may be disposed more inwardly than the side end of the overcoating layer 150.

Meanwhile, in the light emitting display device 800 of FIG. 9, a structure in which the oxygen absorbing layer 880 is disposed on the adhesive layer 170 is illustrated, but is not limited thereto.

For example, the oxygen absorbing layer may be disposed under the adhesive layer 170.

Also, the oxygen absorbing layer can be incorporated into the adhesive layer. Specifically, similar to a structure in which the hydrogen absorbing filler is dispersed inside the adhesive layer 170 in the light emitting display device 500 illustrated in FIG. 6, oxygen absorbing fillers constituting the oxygen absorbing layer may be dispersedly disposed inside the adhesive layer 170.

Also, similarly to a structure in which the hydrogen absorbing filler is disposed only in the first adhesive layer 771 which is a lower area of the adhesive layer 770 in the light emitting display device 500 illustrated in FIG. 8, the oxygen absorbing filler constituting the oxygen absorbing layer may be disposed only in a lower area of the adhesive layer to be adjacent to the transistor and passivation layer.

The exemplary aspects of the present disclosure can also be described as follows:

According to an aspect of the present disclosure, there is provided a light emitting display device. The light emitting display device includes a lower substrate, a thin film transistor on the lower substrate, a passivation layer disposed on the thin film transistor and including hydrogen, an overcoating layer disposed on the passivation layer and planarizing the passivation layer, a light emitting element disposed on the overcoating layer and including an anode, a light emitting layer on the anode, and a cathode on the light emitting layer, a bank disposed on the overcoating layer and defining a light emitting area, an adhesive layer on the light emitting element and the bank, and a hydrogen absorbing layer disposed on the adhesive layer and including a hydrogen absorbing filler, wherein a side end of the bank is disposed more inwardly than side ends of the adhesive layer and the hydrogen absorbing layer, wherein the side ends of the adhesive layer and the hydrogen absorbing layer are disposed more inwardly than a side end of the overcoating layer.

The side end of the hydrogen absorbing layer and the side end of the adhesive layer may be collinearly disposed.

The side end of the bank may be disposed closer to the side end of the overcoating layer than a boundary of the light emitting area.

The side end of the bank may be disposed closer to a boundary of the light emitting area than the side end of the overcoating layer.

The light emitting layer may be disposed to cover an upper surface of the bank, and the cathode may be disposed to cover an upper surface and a side surface of the light emitting layer and to cover the upper surface of the bank.

The light emitting layer may be disposed to cover an upper surface of the bank, and the cathode may be disposed to cover an upper surface and a side surface of the light emitting layer and to cover the upper surface and a side surface of the bank.

The light emitting display device may further comprise an upper protective layer covering an upper surface of the light emitting element.

The adhesive layer may planarize the light emitting element and the bank.

The adhesive layer may be in contact with the overcoating layer, the light emitting element, and the bank.

The hydrogen absorbing filler may include one or more of an inorganic material and an organic material, and the inorganic material may include one or more of a metal, a mixture including the metal, and a compound including the metal, and the organic material includes one or more of a hydroxy benzophenone-based compound, a hydroxy phenylbenzotriazole-based compound, and a hindered amines-based compound.

The metal may include one or more of an alkali metal, an alkaline earth metal, a rare earth metal, a titanium (Ti) group metal, a transition metal, and a post-transition metal.

The metal may include one or more of thorium (Th), zirconium (Zr), vanadium (V), palladium (Pd), titanium (Ti), magnesium (Mg), nickel (Ni), tin (Sn), platinum (Pt), chromium (Cr), silver (Ag), aluminum (Al), copper (Cu), gold (Au), cobalt (Co) and iron (Fe).

The mixture may include one or more of lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

The metal may be a plurality of particles having a diameter of several to several tens of nanometers.

The hydrogen absorbing filler may be dispersed in the hydrogen absorbing layer.

The hydrogen absorbing layer may be included in the adhesive layer.

The hydrogen absorbing filler of the hydrogen absorbing layer may be a first hydrogen absorbing filler including the inorganic material, and the adhesive layer may further include a second hydrogen absorbing filler including the organic material.

The adhesive layer may include a first adhesive layer and a second adhesive layer on the first adhesive layer, and the hydrogen absorbing filler of the hydrogen absorbing layer may be a first hydrogen absorbing filler including the inorganic material, and the first adhesive layer may be formed of a second hydrogen absorbing filler including an adhesive material and the organic material, and the second adhesive layer may be formed of an adhesive material.

The thin film transistor may include a semiconductor layer, and the semiconductor layer may be formed of an oxide semiconductor or an amorphous semiconductor.

The anode may include a transparent conductive layer, or a reflective layer and a transparent conductive layer on the reflective layer.

The light emitting display device may further comprise a color filter disposed to overlap the light emitting element and including hydrogen.

One or more of the hydrogen absorbing layer and the adhesive layer may further include an oxygen absorbing filler.

The oxygen absorbing filler may include an inorganic material including one or more of an antioxidant, carbon nanotube (CNT), and graphene; or an organic material including one or more of silica, zeolite, titania, zirconia, and montmorillonite.

The oxygen absorbing filler of the organic material may be a particle surface-modified with vinyl-based, glycidoxy-based, methacryl-based, amino-based, and mercapto-based silane coupling agents or alkoxide-based, chelating-based, and acylate-based titanium coupling agents.

According to another aspect of the present disclosure, there is provided a light emitting display device. The light emitting display device comprises a lower substrate, a thin film transistor on the lower substrate, a passivation layer disposed on the thin film transistor and including hydrogen, an overcoating layer disposed on the passivation layer and planarizing the passivation layer, a light emitting element disposed on the overcoating layer and including an anode, a light emitting layer on the anode, and a cathode on the light emitting layer, a bank disposed on the overcoating layer and defining a light emitting area, and an adhesive layer disposed on the light emitting element and the bank and including a hydrogen absorbing filler or an oxygen absorbing filler. And, the hydrogen absorbing filler or the oxygen absorbing filler is disposed to be adjacent to the passivation layer.

The adhesive layer may include a first adhesive layer disposed on the passivation and a second adhesive layer disposed on the first adhesive layer, and the first adhesive layer may be composed of a curable resin and one or more of the hydrogen absorbing filler and the oxygen absorbing filler, and the second adhesive layer may be composed of a curable resin.

The hydrogen absorbing filler may include one or more of a hydroxy benzophenone-based compound, a hydroxy phenylbenzotriazole-based compound, and a hindered amines-based compound.

The oxygen absorbing filler may include an inorganic material including one or more of an antioxidant, carbon nanotube (CNT), and graphene; or an organic material including one or more of silica, zeolite, titania, zirconia, and montmorillonite.

The curable resin of the first adhesive layer may include one or more of polyvinyl alcohol (PVA), polyvinylidene chloride (PVDC), ethylene vinyl alcohol (EVOH), polyacrylonitrile (PAN) and polychlorotrifluoroethylene (PCTFE).

The light emitting display device may further comprise a hydrogen absorbing layer disposed on the adhesive layer and including a hydrogen absorbing filler of an inorganic material including one or more of a metal, a mixture including the metal, and a compound including the metal.

Although the present disclosure is described in detail with reference to the accompanying drawings, the present disclosure is not limited thereto and may be embodied in many different forms without departing from the technical concept of the present disclosure. Therefore, the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display device, comprising:
   a lower substrate;
   a thin film transistor disposed on the lower substrate;
   a passivation layer disposed on the thin film transistor and including hydrogen;
   an overcoating layer disposed on the passivation layer and planarizing the passivation layer;
   a light emitting element disposed on the overcoating layer and including an anode, a light emitting layer disposed on the anode, and a cathode disposed on the light emitting layer;
   a bank disposed on the overcoating layer and defining a light emitting area;
   an adhesive layer disposed on the light emitting element and the bank; and
   a hydrogen absorbing layer disposed on the adhesive layer and including a hydrogen absorbing filler,
   wherein the bank has a side end disposed more inwardly than side ends of the adhesive layer and the hydrogen absorbing layer, and
   wherein the side ends of the adhesive layer and the hydrogen absorbing layer are disposed more inwardly than a side end of the overcoating layer.

2. The light emitting display device of claim 1, wherein the side end of the hydrogen absorbing layer and the side end of the adhesive layer are collinearly disposed.

3. The light emitting display device of claim 1, wherein the side end of the bank is disposed closer to the side end of the overcoating layer than a boundary of the light emitting area.

4. The light emitting display device of claim 1, wherein the side end of the bank is disposed closer to a boundary of the light emitting area than the side end of the overcoating layer.

5. The light emitting display device of claim 1, wherein the light emitting layer covers an upper surface of the bank, and
   wherein the cathode covers an upper surface and a side surface of the light emitting layer and the upper surface of the bank.

6. The light emitting display device of claim 1, wherein the light emitting layer covers an upper surface of the bank, and
wherein the cathode covers an upper surface and a side surface of the light emitting layer and covers the upper surface and a side surface of the bank.

7. The light emitting display device of claim 1, further comprising an upper protective layer covering an upper surface of the light emitting element.

8. The light emitting display device of claim 1, wherein the adhesive layer planarizes the light emitting element and the bank.

9. The light emitting display device of claim 1, wherein the adhesive layer is in contact with the overcoating layer, the light emitting element and the bank.

10. The light emitting display device of claim 1, wherein the hydrogen absorbing filler includes one or more of an inorganic material and an organic material,
wherein the inorganic material includes one or more of a metal, a mixture including the metal, and a compound including the metal, and the organic material includes one or more of a hydroxy benzophenone-based compound, a hydroxy phenylbenzotriazole-based compound, and a hindered amines-based compound.

11. The light emitting display device of claim 10, wherein the metal includes one or more of an alkali metal, an alkaline earth metal, a rare earth metal, a titanium (Ti) group metal, a transition metal, and a post-transition metal.

12. The light emitting display device of claim 10, wherein the metal includes one or more of thorium (Th), zirconium (Zr), vanadium (V), palladium (Pd), titanium (Ti), magnesium (Mg), nickel (Ni), tin (Sn), platinum (Pt), chromium (Cr), silver (Ag), aluminum (Al), copper (Cu), gold (Au), cobalt (Co) and iron (Fe).

13. The light emitting display device of claim 10, wherein the mixture includes one or more of lanthanum-nickel (La—Ni), lanthanum-nickel-aluminum (La—Ni—Al), nickel-magnesium (Ni—Mg), iron-titanium (Fe—Ti), and titanium-manganese (Ti—Mn).

14. The light emitting display device of claim 10, wherein the metal is a plurality of particles having a diameter of several to several tens of nanometers.

15. The light emitting display device of claim 1, wherein the hydrogen absorbing filler is dispersed in the hydrogen absorbing layer.

16. The light emitting display device of claim 11, wherein the hydrogen absorbing layer is included in the adhesive layer.

17. The light emitting display device of claim 10, wherein the hydrogen absorbing filler of the hydrogen absorbing layer is a first hydrogen absorbing filler including the inorganic material, and
wherein the adhesive layer further includes a second hydrogen absorbing filler including the organic material.

18. The light emitting display device of claim 10, wherein the adhesive layer includes a first adhesive layer and a second adhesive layer disposed on the first adhesive layer,
wherein the hydrogen absorbing filler of the hydrogen absorbing layer is a first hydrogen absorbing filler including the inorganic material, and
wherein the first adhesive layer is formed of a second hydrogen absorbing filler including an adhesive material and the organic material, and the second adhesive layer is formed of an adhesive material.

19. The light emitting display device of claim 1, wherein the thin film transistor includes a semiconductor layer, and
wherein the semiconductor layer includes an oxide semiconductor or an amorphous semiconductor.

20. The light emitting display device of claim 1, wherein the anode includes a transparent conductive layer, or a reflective layer and a transparent conductive layer disposed on the reflective layer.

21. The light emitting display device of claim 1, further comprising a color filter overlaps with the light emitting element and including hydrogen.

22. The light emitting display device of claim 1, wherein one or more of the hydrogen absorbing layer and the adhesive layer further include an oxygen absorbing filler.

23. The light emitting display device of claim 22, wherein the oxygen absorbing filler includes an inorganic material including one or more of an antioxidant, carbon nanotube (CNT), and graphene; or an organic material including one or more of silica, zeolite, titania, zirconia, and montmorillonite.

24. The light emitting display device of claim 23, wherein the oxygen absorbing filler of the organic material is a particle surface-modified with vinyl-based, glycidoxy-based, methacryl-based, amino-based, and mercapto-based silane coupling agents or alkoxide-based, chelating-based, and acylate-based titanium coupling agents.

* * * * *